(12) United States Patent
Foltyn et al.

(10) Patent No.: US 7,593,758 B2
(45) Date of Patent: Sep. 22, 2009

(54) SEGMENTED SUPERCONDUCTING TAPE HAVING REDUCED AC LOSSES AND METHOD OF MAKING

(75) Inventors: Stephen R. Foltyn, Los Alamos, NM (US); Quanxi Jia, Los Alamos, NM (US); Paul N. Arendt, Los Alamos, NM (US); Terry G. Holesinger, Los Alamos, NM (US); Haiyan Wang, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 427 days.

(21) Appl. No.: 11/245,722

(22) Filed: Oct. 6, 2005

(65) Prior Publication Data

US 2007/0191202 A1    Aug. 16, 2007

(51) Int. Cl.
*H01B 12/00* (2006.01)
*H01L 39/06* (2006.01)
(52) U.S. Cl. .................. 505/231; 505/237; 505/238; 428/697; 428/701; 428/702; 174/125.1; 29/599
(58) Field of Classification Search .............. 505/100, 505/230, 231, 237, 238, 410, 431, 440; 428/701, 428/702, 930; 29/599; 174/125.1
See application file for complete search history.

(56) References Cited

U.S. PATENT DOCUMENTS 5,650,378 A    7/1997  Iijima et al.
5,872,080 A    2/1999  Arendt et al.
6,537,689 B2 * 3/2003  Schoop et al. ............... 428/701

FOREIGN PATENT DOCUMENTS

WO    WO 95/03938    *  2/1995
WO    WO 2005/024963    *  3/2005

OTHER PUBLICATIONS

Wang et al., "Mapping the Current Distribution in $Yba_2Cu_3O_{7-x}$ Thin Films with Striations," Physica C 419 (2005) 79-84.
Levin et al., "Concept of multiply connected Superconducting Tapes," IEE Transactions on Applied Superconductivity, vol. 15, No. 2, Jun. 2005 pp. 2158-2161.
Levin et al., "Magnetization Losses in Multifilament Coated Superconductors," Appl. Phys. Lett. 86, 072509 (2005).

* cited by examiner

*Primary Examiner*—Stanley Silverman
*Assistant Examiner*—Kallambella Vijayakumar
(74) *Attorney, Agent, or Firm*—Robert P. Santandrea; Bruce H. Cottrell

(57) ABSTRACT

A superconducting tape having reduced AC losses. The tape has a high temperature superconductor layer that is segmented. Disruptive strips, formed in one of the tape substrate, a buffer layer, and the superconducting layer create parallel discontinuities in the superconducting layer that separate the current-carrying elements of the superconducting layer into strips or filament-like structures. Segmentation of the current-carrying elements has the effect of reducing AC current losses. Methods of making such a superconducting tape and reducing AC losses in such tapes are also disclosed.

21 Claims, 6 Drawing Sheets

US 7,593,758 B2

SEGMENTED SUPERCONDUCTING TAPE HAVING REDUCED AC LOSSES AND METHOD OF MAKING

STATEMENT REGARDING FEDERAL RIGHTS

This invention was made with government support under Contract No. W-704-ENG-36, awarded by the U.S. Department of Energy. The government has certain rights in the invention.

BACKGROUND OF INVENTION

The invention relates to superconducting tape. More particularly, the invention relates to superconducting tape having reduced AC losses. Even more particularly, the invention relates to methods of making a superconducting tape having reduced AC losses.

High temperature superconducting tapes, particularly those based on a superconducting yttrium barium copper oxide (YBCO) coating or layer, are being incorporated into applications, such as power transmission, motors, generators, and transformers. In such devices, an alternating current (AC) is passed through the tape.

Although they possess excellent properties when carrying direct current, YBCO-based coated conductors tend to exhibit high losses when used in AC current applications, such as those mentioned above. One approach to reducing such losses has been to divide the tape geometry into strips using standard lithographic techniques. Using this method, narrow strips of the superconducting layer are etched away, leaving a series of parallel superconducting segments. Not only are such lithographic methods costly and time-consuming, but they also are not readily usable with kilometer lengths of superconducting tape that are envisioned in production.

Means of reducing AC losses that are currently available are not adaptable to processing long lengths of superconducting tape. Therefore, what is needed is a method of making superconducting tape having reduced AC losses, wherein the method is adaptable to continuous processing of long lengths of such tape. What is also needed is a superconducting tape that exhibits reduced AC losses.

SUMMARY OF INVENTION

The present invention meets these and other needs by providing a superconducting tape having reduced AC losses. The tape has a high temperature superconductor layer that is segmented. Disruptive strips, formed in one of the tape substrate, a buffer layer, and the superconducting layer create parallel discontinuities in the superconducting layer that separate the current-carrying elements of the superconducting layer into strips or filament-like structures. Segmentation of the current-carrying elements has the effect of reducing AC current losses. Methods of making such a superconducting tape and reducing AC losses in such tapes are also disclosed.

Accordingly, one aspect of the invention is to provide a method of making a superconducting tape having reduced AC losses. The method comprises the steps of: providing a tape substrate; depositing at least one buffer layer on the tape substrate; depositing a layer of superconducting material on the at least one buffer layer; and forming a plurality of disruptive strips on one of the tape substrate, the at least one buffer layer, and the layer of superconducting material. Each of the plurality of disruptive strips is substantially parallel to the current flow direction of the superconducting tape. The plurality of disruptive strips causes parallel discontinuities in electrical properties of the layer of superconducting material.

A second aspect of the invention is to provide a method of reducing AC losses in a superconducting tape, wherein the superconducting tape comprises a tape substrate, at least one buffer layer deposited on the tape substrate, and a superconducting layer deposited on the at least one buffer layer. The method comprises forming a plurality of disruptive strips on one of the tape substrate, the at least one buffer layer, and the superconducting layer. Each of the plurality of disruptive strips is substantially parallel to the current flow direction of the superconducting tape. The plurality of disruptive strips causes parallel discontinuities in electrical properties of the layer of superconducting material that reduce AC losses in the superconducting tape.

A third aspect of the invention is to provide a method of making a superconducting tape having reduced AC losses. The method comprises the steps of: providing a tape substrate; depositing at least one buffer layer on the tape substrate; depositing a layer of superconducting material on the at least one buffer layer; and forming a plurality of disruptive strips on one of the tape substrate, the at least one buffer layer, and the superconducting layer. Each of the plurality of disruptive strips is substantially parallel to the current flow direction of the superconducting tape. The plurality of disruptive strips comprises at least one of a topographical feature and a contaminant material that cause parallel discontinuities in electrical properties of the layer of superconducting material that reduce AC losses in the superconducting tape.

A fourth aspect of the invention is to provide a superconducting tape having reduced AC losses. The superconducting tape comprises: a tape substrate; at least one buffer layer disposed on the tape substrate; a superconducting layer disposed on the at least one buffer layer; and a plurality of disruptive strips on one of the tape substrate, the at least one buffer layer, and the superconducting layer, wherein each of the plurality of disruptive strips is substantially parallel to the current flow direction of the superconducting tape. The plurality of disruptive strips causes parallel discontinuities in electrical properties of the layer of superconducting material that reduce AC losses in the superconducting tape.

These and other aspects, advantages, and salient features of the present invention will become apparent from the following detailed description, the accompanying drawings, and the appended claims.

DETAILED DESCRIPTION

Figure 1:
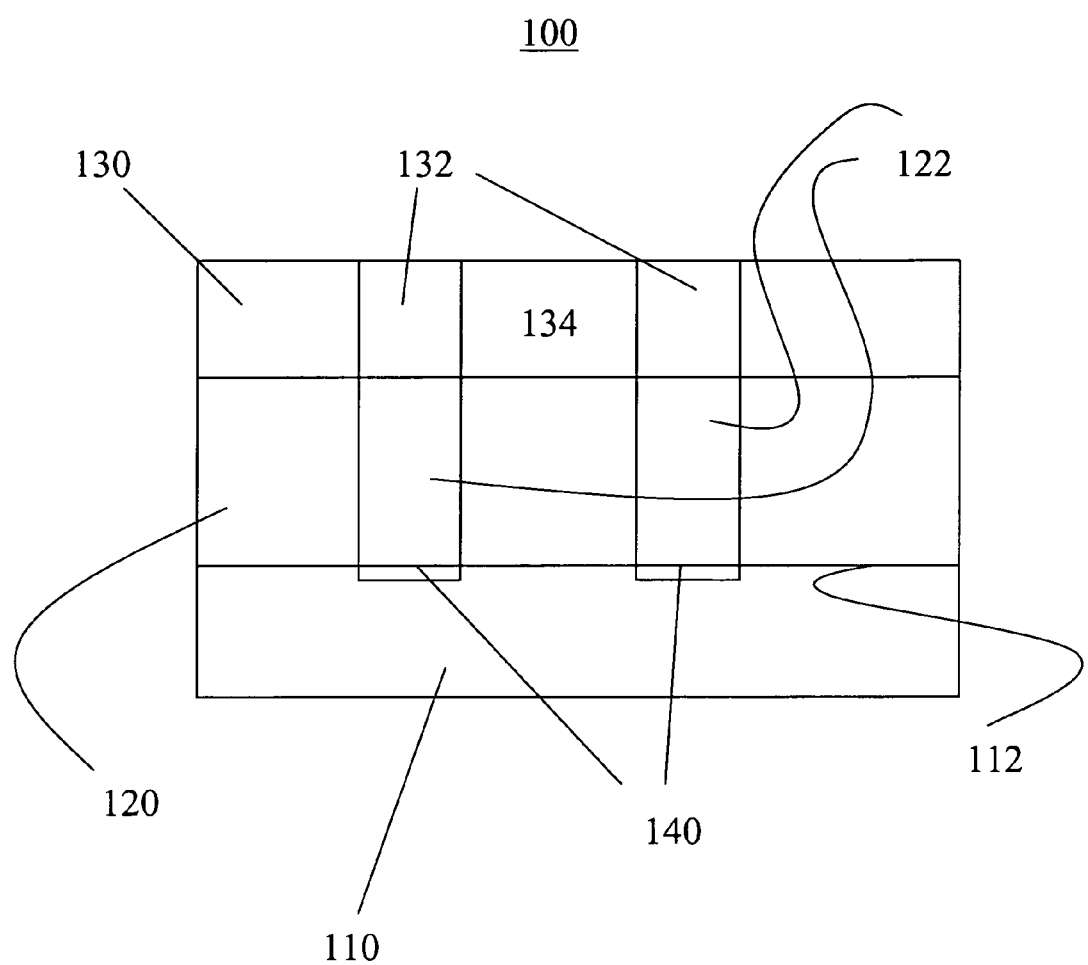
FIG. 1 is a cross-sectional schematic view of a superconducting tape in which a plurality of disruptions is formed in the tape substrate.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing a particular embodiment of the invention and are not intended to limit the invention thereto. Turning to FIG. 1, a cross-sectional schematic view of a superconducting tape is shown. Superconducting tape 100 comprises a tape substrate 110, at least one buffer layer 120 deposited on a surface 112 of tape substrate 110, and a layer of superconducting material 130 deposited on an outer surface 122 of the at least one buffer layer 120. Materials comprising superconducting tape 100, as well as methods of making superconducting tape 100, the at least one buffer layer 110, and the layer of superconducting material 130 are well known in the art. Non-limiting examples of materials selected for tape substrate 110 include, but are not limited to, nickel based alloys, iron based alloys, and combinations thereof. The at least one buffer layer 120 may comprise at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, combinations thereof, and the like. The layer of superconducting material 130, may comprise a rare earth copper oxide such as, but not limited to, yttrium barium copper oxide (also referred to herein as "YBCO") and the like. Methods of depositing the at least one buffer layer 120 and the layer of superconducting material 130, are described in U.S. Pat. No. 5,650,378 by Yauhiro Iijima et al., entitled "Method of making Polycrystalline Thin Film and Superconducting Body," issued on Jul. 22, 1997; and U.S. Pat. No. 5,872,080 by Paul N. Arendt et al., entitled "High Temperature Superconducting Thick Films, issued Feb. 16, 1999. The contents of U. S. Pat. Nos. 5,650,378 and 5,872,080 are incorporated herein by reference in their entirety.

High losses exhibited by high temperature superconducting (also referred to herein as "HTS") conductors, such as HTS tapes, when an alternating current is passed through such conductors limit the use of such conductors in many applications, such as power transmission lines, transformers, generators, and motors. Superconducting tape 100 reduces such losses, referred to herein as "AC losses," by reducing the width of the current-carrying elements in the layer of superconducting material 130.

Superconducting tape 100 includes a plurality of disruptive strips 140, or filament-like structures that are substantially parallel to the current flow 150 (FIG. 2) within superconducting tape 100. The plurality of disruptive strips 140 may be disposed on one of tape substrate 110, the at least one buffer layer 120, and the layer of superconducting material 130. In the embodiment shown in FIG. 1, disruptive strips 140 are located on or near the surface 112 of tape substrate 110. When the at least one buffer layer 120 is deposited on surface 112 of tape substrate 110, discontinuities 122, associated with the plurality of disruptive strips 140, are generated within the at least one buffer layer 120. The disruptive effect is transmitted to the layer of superconducting material 130, producing corresponding discontinuities 132 therein. Discontinuities 132 result in corresponding discontinuities in electrical properties, such as current flow across discontinuities 132, of the layer of superconducting material 130. The superconducting material in discontinuities 132 will exhibit either reduced or no superconductivity.

Figure 2:
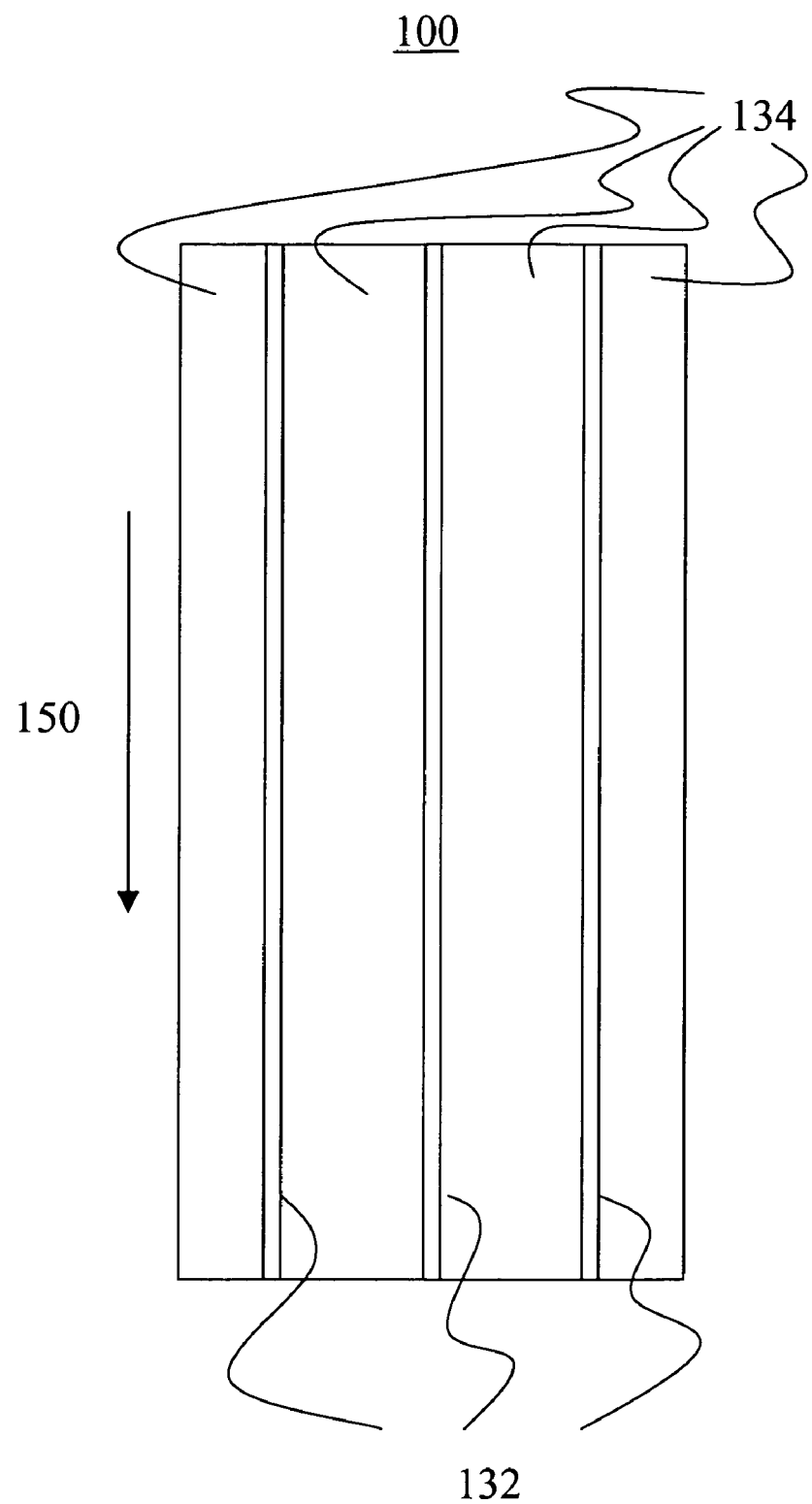
FIG. 2 a schematic top view of a superconducting tape, showing the layer of superconducting material.

FIG. 2 is a top view of superconducting tape 100, showing the layer of superconducting material 130. Discontinuities 132, formed by the plurality of disruptive strips 140, are substantially parallel to each other and to the direction of current 150, and divide the layer of superconducting material into a plurality of superconducting strips 134.

The plurality of disruptive strips 140 may comprise at least one topographical feature, a degradation in crystallinity, or a contaminant material that causes discontinuities 132 in or chemically poisons a portion of the layer of superconducting material. Non-limiting examples of such topographical features include scratches, ridges, a series of depressions, or elevated portions. A degradation in crystallinity may be a localized region having a different crystallographic texture or a lower degree of crystallinity than the surrounding area. The plurality of disruptive strips 140 may be formed in any one of the tape substrate 110, the at least one buffer layer 120, and the layer of superconducting material 130. The layer in which the plurality of disruptive strips 140 is formed depends at least in part upon on the means used to form disruptive strips 140.

Each of the plurality of disruptive strips 140 may extend along the entire length of superconducting tape 100. In one embodiment, each of the plurality of disruptive strips 140 has a length in a range from about 0.1 meter to about 100 meters.

Whereas FIGS. 1-6 each show a superconducting tape 100 having either two or three disruptive strips 140, it is understood that superconducting tape 100 may include more than two or three disruptive strips 140. In one embodiment, superconducting tape 100 includes up to about 20 disruptive strips per centimeter width of superconducting tape 100. Each of the plurality of disruptive strips 140 has a finite width in a range from about 1 micron to about 100 microns.

Figure 3:
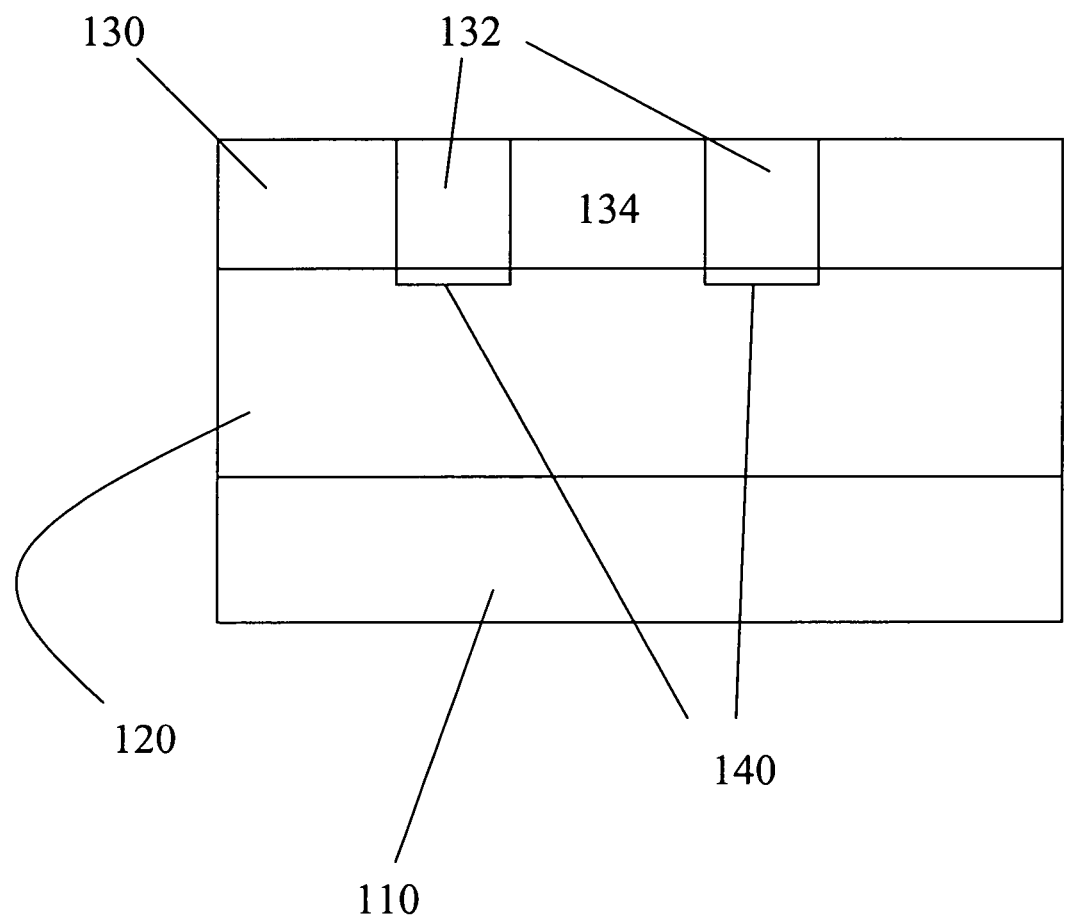
FIG. 3 is a cross-sectional schematic view of a superconducting tape in which a plurality of disruptions is formed in a buffer layer.

In one embodiment, the plurality of disruptive strips 140 includes a plurality of scratches or series of depressions inscribed on one of surface 112 of tape substrate 110 and surface 121 of the at least one buffer layer 120. In one embodiment, the plurality of scratches is made on tape substrate 110 prior to deposition of the at least one buffer layer 120. The plurality of scratches generates discontinuities or disruptions 122 in the at least one buffer layer 120, which in turn affect the growth of the layer of superconducting material 132, producing disruptions or discontinuities 132 in the superconducting layer 130 as well, as shown schematically in FIG. 1. Alternatively, the plurality of scratches may be made in at least one of buffer layers 120 to produce discontinuities 132 in the layer of superconducting material 130, as shown in FIG. 3. The plurality of scratches may be inscribed by engraving tools or instruments that are known in the art, such as a diamond-tipped stylus, scribe, blade, a rotating disk having a hardened edge, and the like. The force needed to form the plurality of scratches or series of depressions depends on the hardness of the surface on which the scratches or depressions are being made. Forming the plurality of disruptive strips 140 by inscribing the plurality of scratches on either tape substrate 110 or the at least one buffer layer provides a fast and inexpensive means of segmenting long lengths of superconducting tape 100, as scratches 112 may be formed while transferring tape substrate 110 from one reel to another.

Figure 4:
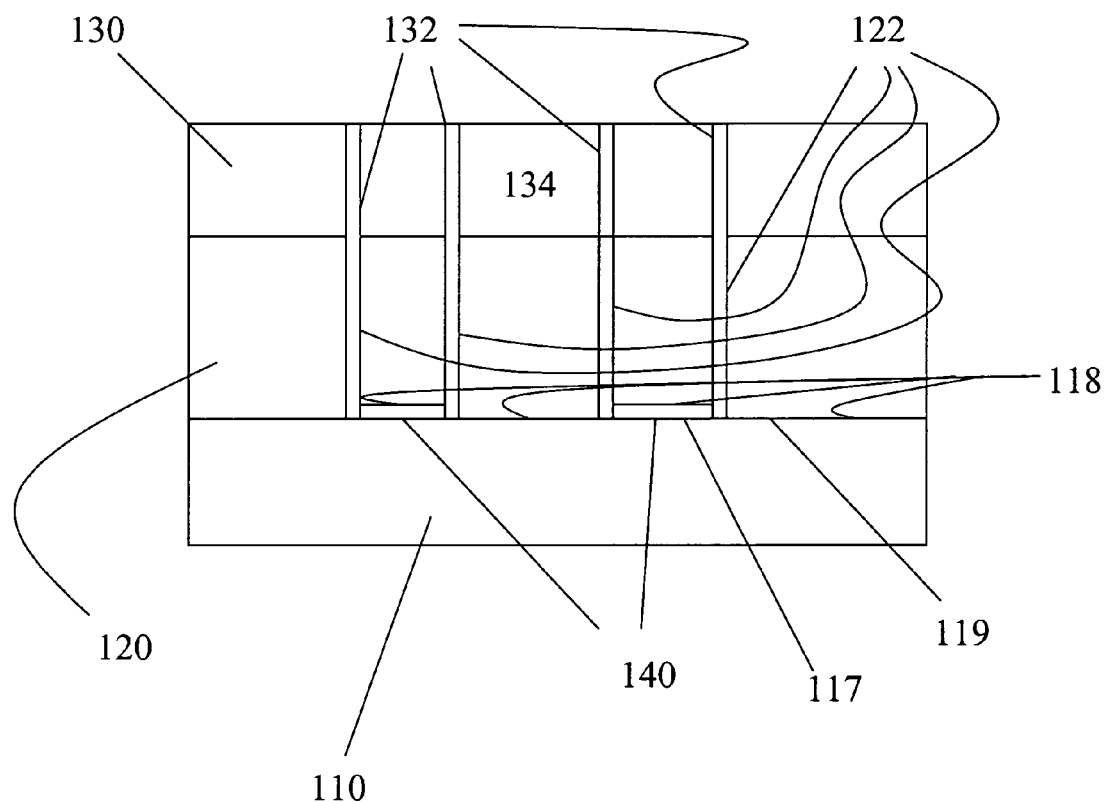
FIG. 4 is cross-sectional schematic view of a superconducting tape in which a plurality of disruptions is formed by forming a plurality of steps in the tape substrate.
Figure 5:
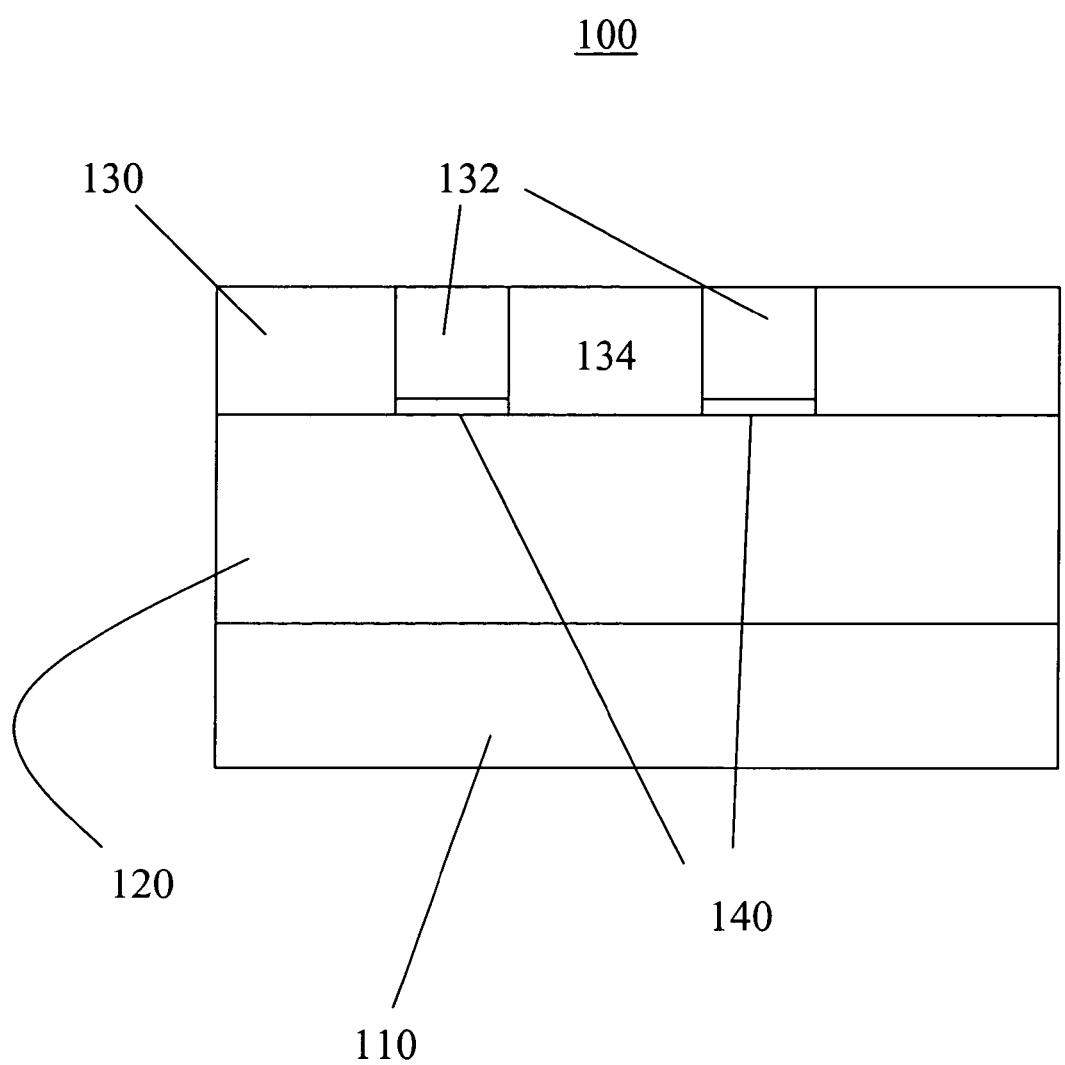
FIG. 5 is a cross-sectional schematic view of a superconducting tape in which a plurality of disruptions is formed in the layer of superconducting material.

In another embodiment, the plurality of disruptive strips 140 comprises a plurality of steps 118 that are formed into tape substrate 110, as shown in FIG. 4, which is a schematic cross-sectional view of superconducting tape 110. Adjacent steps 117 and 119 are of different height. Using a stepped roller, tape substrate 110 is divided into a series of high steps 117 and low steps 119. The subsequently deposited at least one buffer layer 120 and layer of superconducting material 130 would have disruptive strips 122 and discontinuities 132 that isolate the regions deposited over steps 117 and 119 from each other. One advantage of this particular embodiment is that the widths of discontinuities 132 are minimized, thereby maximizing the current carried in a superconducting current of a given width.

In another embodiment, the plurality of disruptive strips 140 is formed by etching one of tape substrate 110, the at least one buffer layer 120, or the layer of superconducting material 130 to form a series of depressions or "etch pits." A tightly focused laser beam may be directed through a mask and onto the surface of either tape substrate 110, the at least one buffer layer 120, or the layer of superconducting material 130 to remove a portion of either the layer of superconducting material 130, the at least one buffer layer 120, or tape substrate 110, to form the plurality of disruptive strips 140. Carbon dioxide lasers, excimer lasers, or solid state lasers such as Nd:YAG lasers, Ti:sapphire lasers, diode lasers, and the like, are among the types of lasers that may be used for etching. Alternatively, an ion beam having an energy in a range from about 200 eV to about 10 keV may be used to etch either tape substrate 110, buffer layers 120, or the superconducting layer 130.

The plurality of disruptive strips 140 may also comprise contaminant materials that have either been deposited on or embedded into one of the at least one buffer layer 120 and the layer of superconducting material 130. The contaminant material may be a metal. Such contaminants may also include, but are not limited to, alkali metals, calcium, magnesium, chromium, nickel, iron, manganese, aluminum, silicon, silicon oxide, and the like. In one embodiment, shown in FIG. 5, ion implantation is used to implant ions of at least one contaminant in portions of the layer of superconducting material 130 to form disruptive strips 132, which poison the superconducting material. To form the plurality of disruptive strips 132, the beam of contaminant ions may be-directed through slits onto either a stationary or moving tape substrate 110 that has been previously coated with the at least one buffer layer 120.

Figure 6:
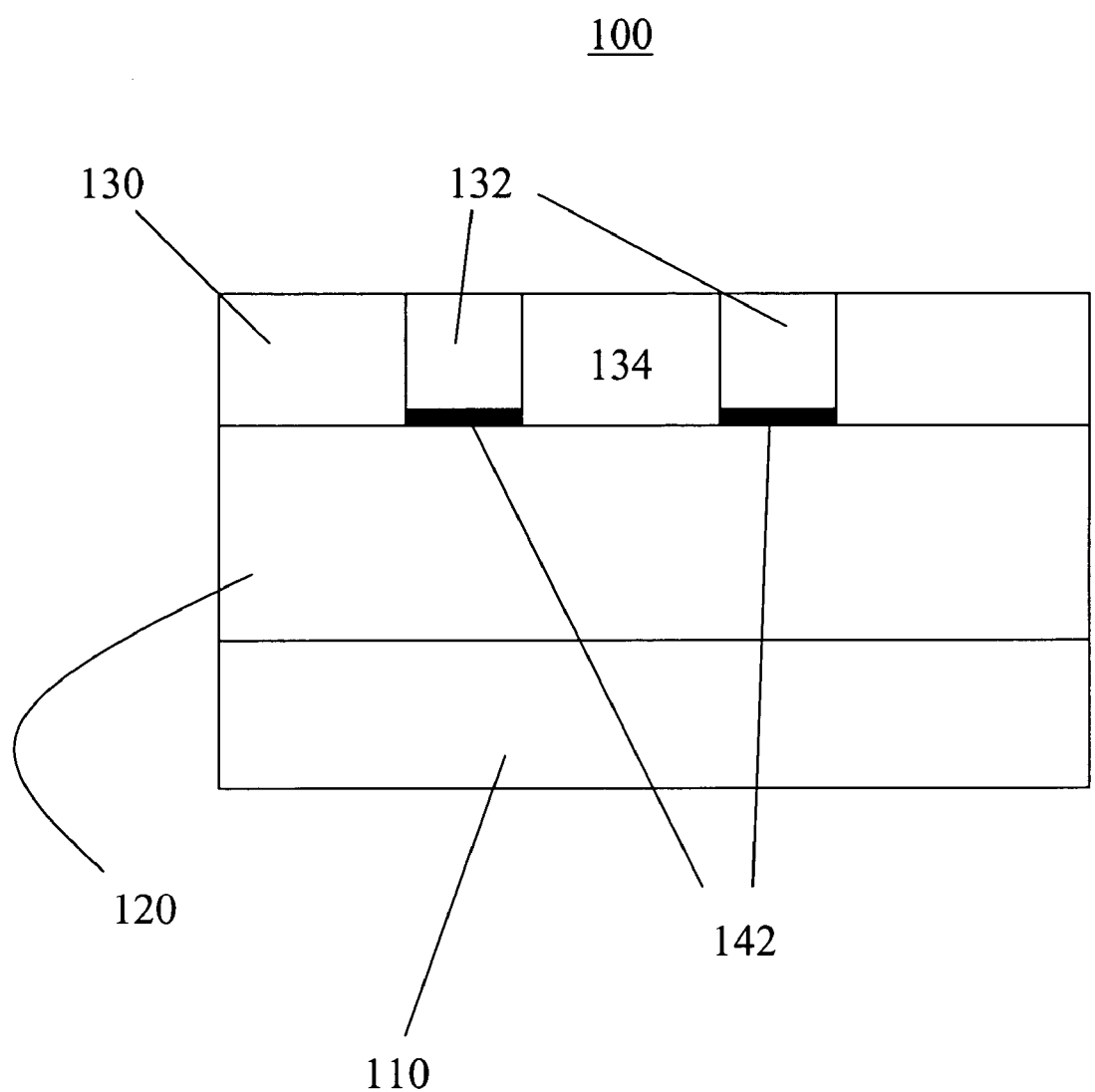
FIG. 6 is a cross-sectional schematic view of a superconducting tape in which a plurality of disruptive stripes deposited on the surface of a buffer layer forms the plurality of disruptions.

In another embodiment, shown in FIG. 6, the plurality of disruptive strips 140 comprises a plurality of disruptive stripes 142 or ridges deposited on the surface 121 of the at least one buffer layer 120 or surface 112 of tape substrate 110. The plurality of disruptive stripes 142 may comprise either chemical contaminants or material that is not crystallographically oriented, and may be deposited by either chemical or physical deposition techniques, or by printing techniques, such as inkjet printing, screen printing, or the like. Disruptive stripes 142 or ridges may be formed by depositing material through a mask while tape substrate 110 is moving below the mask through a deposition or printing zone. The superconducting material deposited on these disruptive stripes 142 lacks crystallographic texture and has severely degraded superconducting properties. The resulting stripes separate superconducting portions of the layer of superconducting material 130.

The plurality of disruptive strips 140 may also be formed during either nucleation or deposition of the at least one buffer layer 120 by placing a shadow mask over the at least one buffer layer 120. The shadowed portions forming the plurality of disruptive strips 140 in the at least one buffer layer 120 do not form a crystallographic texture. Superconducting material deposited on the plurality of disruptive strips 140 has severely degraded superconducting properties and serves to separate superconducting portions of the layer of superconducting material 130.

A method of making superconducting tape 100, described herein, is also provided. The method comprises providing tape substrate 110, depositing at least one buffer layer 120 on tape substrate 110, depositing a layer of superconducting material 130 on the at least one buffer layer, and forming the plurality of disruptive strips 140 on one of the tape substrate 110, the at least one buffer layer 120, and the layer of superconducting material 130. In addition, a method of reducing AC losses in superconducting tape 100, comprising the step of forming a plurality of disruptive strips 140 on one of one of the tape substrate 110, the at least one buffer layer 120, and the layer of superconducting material 130 to cause parallel discontinuities in the layer of superconducting material 130 is also provided. The methods of forming the plurality of disruptive strips 140 and reducing AC losses in superconducting tape 100 have been previously described herein.

The following example illustrates some of the advantages and features of the invention, and is not intended to limit the invention thereto.

EXAMPLE 1

A standard sample of magnesium oxide (MgO) that had been deposited by ion beam assisted deposition (IBAD) on a substrate was scratched with a diamond scribe. The scratch was oriented such that it would cross the current-carrying bridge of a superconducting YBCO layer. Light pressure was used on the scribe, and the resulting scratch profile was measured with a stylus profilometer. The depth and width of the scratch were measured to be about 100 nm and about 15 micrometers, respectively. A strontium titanate ($SrTiO_3$) buffer layer and a YBCO layer having a thickness of about 1 micron were deposited on the substrate by pulsed laser deposition (PLD).

When the resulting sample was patterned and measured, it was found that there was no superconducting path across the bridge. In contrast, similar unscratched samples have critical current densities of over 1 $MA/cm^2$ at 75 K. The resistivity for the bridge was measured as a function of temperature and was found to exhibit semiconducting behavior, as might be caused by reaction between YBCO and metals present within the substrate.

The resistance of YBCO across the scratch was also measured. Whereas unscratched samples typically have resistance levels of about 20 ohms, the resistance measured for the scratched sample was 6,700 ohms. The results indicate that the scratch method effectively isolated the superconducting regions, which is necessary to reduce AC losses.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A superconducting tape having reduced AC losses, the superconducting tape comprising:
   a) a tape substrate;
   b) at least one buffer layer disposed on the tape substrate;
   c) a superconducting layer disposed on the at least one buffer layer; and d) a plurality of disruptive strips on one of the tape substrate, the at least one buffer layer, and the superconducting layer, wherein each of the plurality of disruptive strips is substantially parallel to the current flow direction of the superconducting tape, and wherein the plurality of disruptive strips causes parallel discontinuities in electrical properties of the layer of superconducting material that reduce AC losses in the superconducting tape, said disruptive strips comprising a contaminant material.

2. The superconducting tape according to claim 1, wherein the contaminant material is a metal.

3. The superconducting tape according to claim 1, wherein the plurality of disruptive strips comprises a plurality of impurity ions implanted in the layer of superconducting material.

4. The superconducting tape according to claim 1, wherein each of the plurality of disruptive strips has a width in a range from about 1 micron to about 100 microns.

5. The superconducting tape according to claim 1, wherein each of the plurality of disruptive strips has a length in a range from about 0.1 meter to about 100 meters.

6. The superconducting tape according to claim 1, wherein each of the plurality of disruptive strips extends along the entire length of the superconducting tape.

7. The superconducting tape according to claim 1, where a cross-section of the superconducting tape includes up to about 20 disruptive strips per centimeter of the superconducting tape.

8. The superconducting tape according to claim 1, wherein the tape substrate cornprisesat least one of a nickel based alloy, an iron based alloy, and combinations thereof.

9. The superconducting tape according to claim 1, wherein the at least one buffer layer comprises at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, and combinations thereof.

10. The superconducting tape according to claim 1, wherein the layer of superconducting material comprises a rare earth copper oxide.

11. The superconducting tape according to claim 10, wherein the rare earth copper oxide is yttrium barium copper oxide.

12. The superconducting tape according to claim 1 wherein the tape substrate comprises at least one of a nickel based alloy, an iron based alloy, and combinations thereof, wherein the at least one buffer layer comprises at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, and combinations thereof, and wherein the layer of superconducting material comprises a rare earth copper oxide.

13. A superconducting tape having reduced AC losses, the superconducting tape comprising:
    a) a tape substrate;
    b) at least one buffer layer disposed on the tape substrate;
    c) a superconducting layer disposed on the at least one buffer layer; and
    d) a plurality of disruptive strips on one of the tape substrate, the at least one buffer layer, and the superconducting layer, wherein each of the plurality of disruptive strips is substantially parallel to the current flow direction of the superconducting tape, and wherein the plurality of disruptive strips causes parallel discontinuities in electrical properties of the layer of superconducting material that reduce AC losses in the superconducting tape, wherein each of the plurality of disruptive strips comprises a contaminant material that causes the discontinuity, wherein the contaminant material comprises at least one of an alkali metal, calcium, magnesium, chromium, nickel, iron, silicon, silicon oxide, manganese, and combinations thereof.

14. The superconducting tape according to claim 13 wherein the tape substrate comprises at least one of a nickel based alloy, an iron based alloy, and combinations thereof, wherein the at least one buffer layer comprises at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, and combinations thereof, and wherein the layer of superconducting material comprises a rare earth copper oxide.

15. The superconducting tape according to claim 14, wherein the rare earth copper oxide is yttrium barium copper oxide.

16. A superconducting tape having reduced AC losses, the superconducting tape comprising:
    a) a tape substrate;
    b) at least one buffer layer disposed on the tape substrate;
    c) a superconducting layer disposed on the at least one bufferlayer; and
    d) a plurality of disruptive strips on one of the tape substrate, the at least one buffer layer, and the superconducting layer, wherein each of the plurality of disruptive ships is substantially parallel to the current flow direction of the superconducting tape, and wherein the plurality of disruptive strips causes parallel discontinuities in electrical properties of the layer of superconducting material that reduce AC losses in the superconducting tape, wherein each of the plurality of disruptive strips comprises at least one of a topographical feature, a degradation in crystallinity, and a contaminant material that causes the discontinuity, wherein the plurality of disruptive strips comprises a plurality of steps rolled into the tape substrate, wherein adjacent steps are of a different height.

17. The superconducting tape according to claim 16 wherein the tape substrate comprises at least one of a nickel based alloy, an iron based alloy, and combinations thereof, wherein the at least one buffer layer comprises at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, and combinations thereof, and wherein the layer of superconducting material comprises a rare earth copper oxide.

18. The superconducting tape according to claim 17, wherein the rare earth copper oxide is yttrium barium copper oxide.

19. A superconducting tape having reduced AC losses, the superconducting tape comprising:
    a) a tape substrate;
    b) at least one buffer iayer disposed on the tape substrate;
    c) a superconducting layer disposed on the at least one buffer layer; and
    d) a plurality of disruptive strips on one of the tape substrate, the at least one buffer layer, and the superconducting layer, wherein each of. the plurality of disruptive strips is substantially parallel to the current flow direction of the superconducting tape, and wherein the plurality of disruptive strips causes parallel discontinuities in electrical properties of the layer of superconducting material that reduce AC losses in the superconducting tape, wherein each of the plurality of disruptive strips comprises a contaminant material that causes the discontinuity, wherein the plurality of disruptive strips comprises a plurality of Impurity ions implanted in the layer of superconducting material and wherein the contaminant material comprises at least one of an alkali metal, calcium, magnesium, chromium, nickel, iron, silicon, silicon oxide, manganese, and combinations thereof.

20. The superconducting tape according to claim 19 wherein the tape substrate comprises at least one of a nickel based alloy, an iron based alloy, and combinations thereof, wherein the at least one buffer layer comprises at least one of magnesium oxide, strontium oxide, strontium titanate, yttrium stabilized zirconia, strontium ruthenate, barium zirconate, cerium oxide, lanthanum manganate, a rare-earth zirconate, a rare-earth hafnate, and combinations thereof, and wherein the layer of superconducting material comprises a rare earth copper oxide.

21. The superconducting tape according to claim 20, wherein the rare earth copper oxide is yttrium barium copper oxide.

* * * * *